(12) United States Patent
Tao et al.

(10) Patent No.: US 6,229,702 B1
(45) Date of Patent: May 8, 2001

(54) BALL GRID ARRAY SEMICONDUCTOR PACKAGE HAVING IMPROVED HEAT DISSIPATION EFFICIENCY, OVERALL ELECTRICAL PERFORMANCE AND ENHANCED BONDING CAPABILITY

(75) Inventors: Su Tao, Kaohsiung; Chin-Long Wu, Sanchung; Tai-Chun Huang, Kaohsiung; Han-Hsiang Huang, Pingtung Hsien; Shih-Kuang Chen; Shin-Hua Chao, both of Kaohsiung, all of (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 09/323,904

(22) Filed: Jun. 2, 1999

(51) Int. Cl.[7] ................................................ H05K 7/20
(52) U.S. Cl. ..................... 361/704; 165/80.2; 165/80.3; 174/52.2; 174/52.4; 174/35 GC; 257/659; 257/713; 257/718; 257/796; 361/710; 361/718
(58) Field of Search ................................ 165/80.2, 80.3, 165/185; 174/52.2, 52.3, 52.4, 35 R, 35 GC; 257/659–660, 675, 697–698, 706–707, 712–713, 718–720, 726–727, 787, 788, 796; 361/704, 707–708, 710, 717–720, 722, 816, 818

(56) References Cited

U.S. PATENT DOCUMENTS

| | | | | |
|---|---|---|---|---|
| 5,789,813 | * | 8/1998 | Kirkland et al. | 257/712 |
| 5,940,271 | * | 8/1999 | Mertol | 361/704 |
| 5,986,340 | * | 11/1999 | Mostafazadeh et al. | 257/713 |
| 6,011,304 | * | 1/2000 | Mertol | 257/706 |

* cited by examiner

Primary Examiner—Gregory Thompson
(74) Attorney, Agent, or Firm—Bacon & Thomas

(57) ABSTRACT

A ball grid array semiconductor package includes a substrate, a die mounted on the substrate and electrically connected to the substrate by bonding wires, a heat ring mounted on the substrate to surround the die and the bonding wires, and a heat slug mounted on the heat ring to entirely cover the die and the bonding wires thereby providing improved heat dissipation efficiency and overall electrical performance. Encapsulation material is filled into an inner space surrounded by the heat ring, heat slug and substrate to form an encapsulant for protecting the die and bonding wires. The heat ring and heat slug has at least a portion of surface area sequentially coated with a metal medium layer and an insulation layer to enhance the bonding degree between the encapsulant and the heat ring and heat slug.

19 Claims, 7 Drawing Sheets

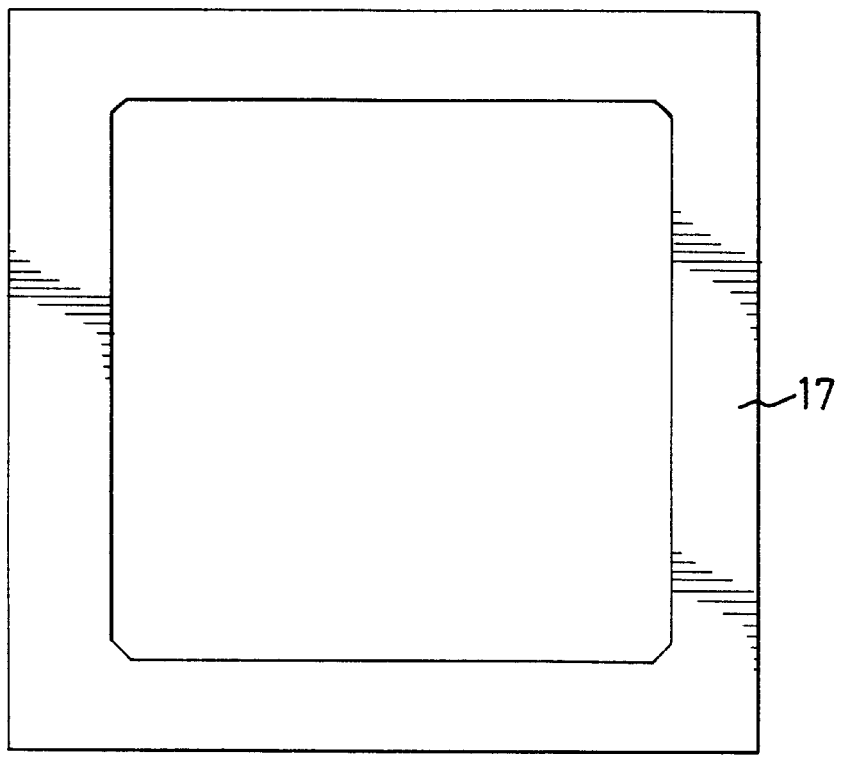
F I G. 4A
F I G. 4B

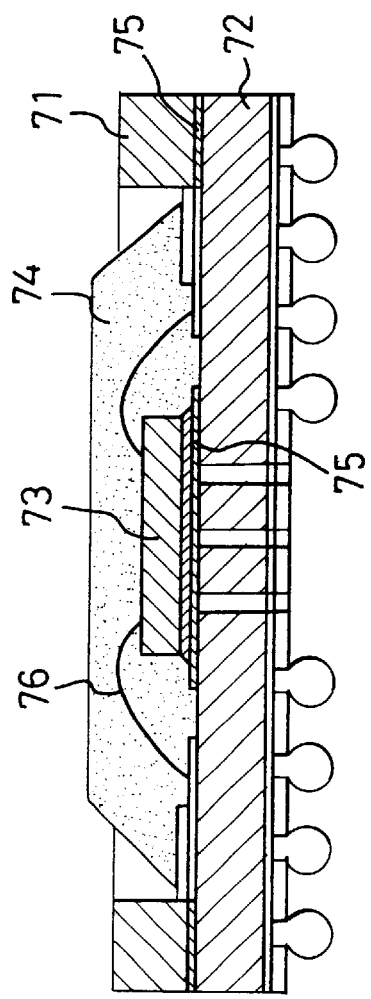
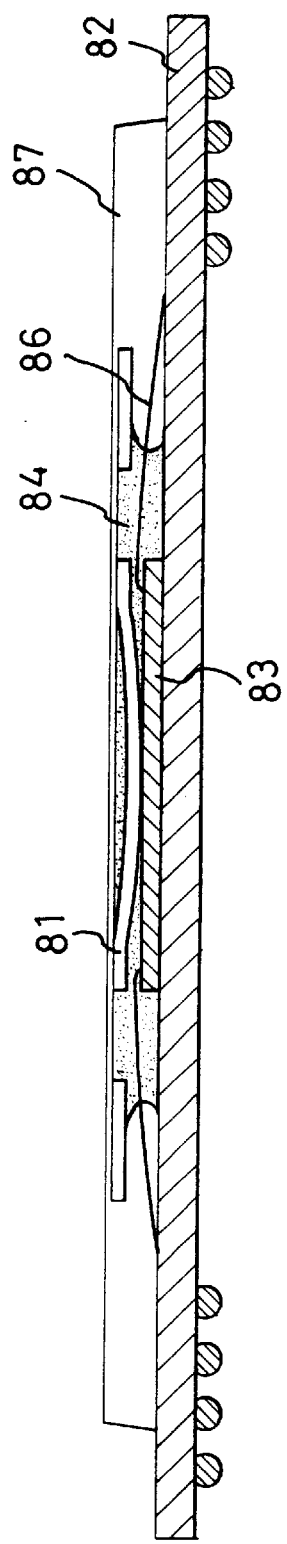
FIG. 10
PRIOR ART
FIG. 11
PRIOR ART

BALL GRID ARRAY SEMICONDUCTOR PACKAGE HAVING IMPROVED HEAT DISSIPATION EFFICIENCY, OVERALL ELECTRICAL PERFORMANCE AND ENHANCED BONDING CAPABILITY

BACKGROUND OF THE INVENTION

1. Field of the Invention

The present invention relates to a ball grid array semiconductor package, and more particularly, to a ball grid array semiconductor package having a heat ring and a heat slug both coated with a metal medium layer and an insulation layer for providing improved heat dissipation efficiency, overall electrical performance and enhanced bonding capability.

2. Description of Related Art

With the rapid advances in the field of electronic engineering, the function of a semiconductor device is getting more and more complicated, and the number of pins of the semiconductor device is increased rapidly. Therefore, the ball grid array (BGA) package, which allows more pins to be arranged in a semiconductor device, is welcomed and widely used. However, the semiconductor device with complicated function is usually provided with a high signal processing speed so that the semiconductor device may generate excess heat when working. Therefore, it is important to dissipate the excess heat away thereby maintaining the semiconductor device to operate in a proper range of temperature.

U.S. Pat. No. 5,708,567 granted to Shim et al. has provided an BGA semiconductor package with ring-type heat sink to improve the heat dissipation efficiency. With reference to FIG. 10, the ring-type heat sink (71) is attached to a substrate (72) via an extended portion of a die paddle (75) such that the heat sink (71) surrounds the encapsulant (74) of the package. Therefore, heat generated by the die (73) can be dissipated via the extended die paddle (75) and the heat sink (71). Furthermore, because the heat sink (71) surrounds the die (73), it also contributes in providing electrical shielding effect. However, for such a semiconductor package, heat cannot be effectively dissipated via the encapsulant (74). The bonding wires (76), that are used to electrically connect the die (73) with the substrate (72), are not shield by metal. Moreover, the adhesive bonding between the encapsulant (74) and the extended die paddle (75) is not satisfactory. Accordingly, the reliability of such a semiconductor package is low.

U.S. Pat. No. 5,736,785 granted to Chiang et al. has provided a semiconductor package with a heat spreader to improve the heat dissipation efficiency. With reference to FIG. 11, the semiconductor package has a heat spreader (81) attached over a die (83) which is mounted on a substrate (82). The heat spreader (81) contacts with the die (83) so that heat generated by the die (83) can be transferred to the heat spreader (81). The die (83) and the heat spreader (81) are covered by a packaged body (87). Encapsulation material, such as epoxy, is filled in the packaged body (87). With this package structure, heat generated by the die (83) can be dissipated away via the heat spreader (81). Furthermore, because the heat spreader (81) is attached over the die (83), part of the bonding wires (86) can be shielded by the heat spreader (81). However, because the path to dissipate heat for such a package structure is restricted in the upper surface area thereof, the heat dissipation efficiency is limited. The electrical shielding is only provided on an area above the die (83) and bonding wires (86). The conductive trace (not shown) on the outer area of the substrate (82) is not shielded. Moreover, the bonding effect between the epoxy encapsulant (84) and the heat spreader (81) is not satisfactory so that the reliability of the packaged semiconductor device is low. Therefore, there is a need for the above semiconductor package to be improved.

SUMMARY OF THE INVENTION

The objective of the present invention is to provide a ball grid array semiconductor package having improved heat dissipation efficiency, overall electrical performance and enhanced bonding capability To achieve the objective, the ball grid array semiconductor package in accordance with the present invention includes a substrate, a die mounted on the substrate and electrically connected to the substrate by bonding wires, a heat ring also mounted on the substrate to surround the die and the bonding wires, and a heat slug mounted on the heat ring to cover the die and the bonding wires. Encapsulation material is filled into an inner space surrounded by the heat ring, heat slug and substrate to form an encapsulant for protecting the die and bonding wires. The heat ring and heat slug has at least a portion of surface area sequentially coated with a metal medium layer and an insulation layer.

Other objectives, advantages, and novel features of the invention will become more apparent from the following detailed description when taken in conjunction with the accompanying drawings.

BRIEF DESCRIPTION OF THE DRAWINGS

FIG. 4A is a top plain view of a heat ring used in the BGA semiconductor package shown in FIG. 3;

FIG. 4B is a side cross sectional view of the heat ring used in the BGA semiconductor package shown in FIG. 3;

FIG. 10 is a side cross sectional view of a conventional BGA semiconductor package; and FIG. 11 is a side cross sectional view of another conventional BGA semiconductor package.

DETAILED DESCRIPTION OF THE PREFERRED EMBODIMENT

Figure 1:
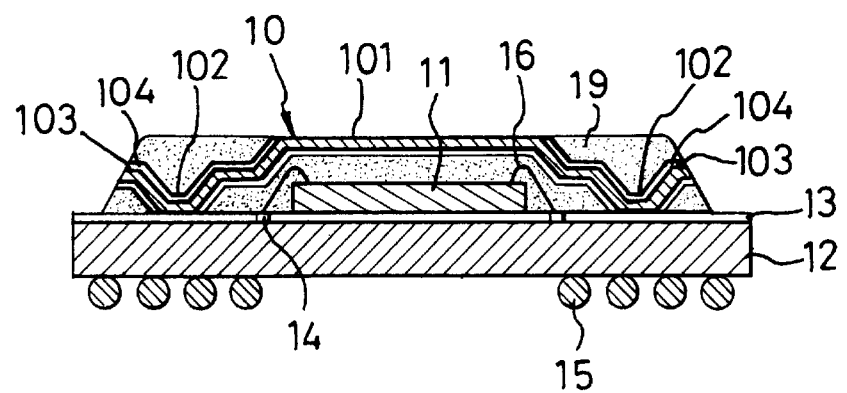
FIG. 1 is a side cross sectional view of a first preferred embodiment of the BGA semiconductor package in accordance with the present invention.

FIG. 1 shows the structure of the BGA semiconductor package which includes a substrate (12) having an upper face formed thereon solder mask (13) and electrical conductive trace (14) for providing circuit connection function. A plurality of solder balls (15) are formed on the lower face of the substrate (12) for providing power and signal input/output function. A die (11) is attached to the upper face of the substrate (12). The die (11) is electrically coupled to the substrate (12) by connecting bonding wires (16) to the electrical conductive trace (14). A heat sink (10) is mounted on the substrate (12) to cover the die (11) to increase the effective heat dissipation area. The die (11) and the bonding wires (16) are encapsulated and protected by an epoxy encapsulant (19).

Figure 2A:
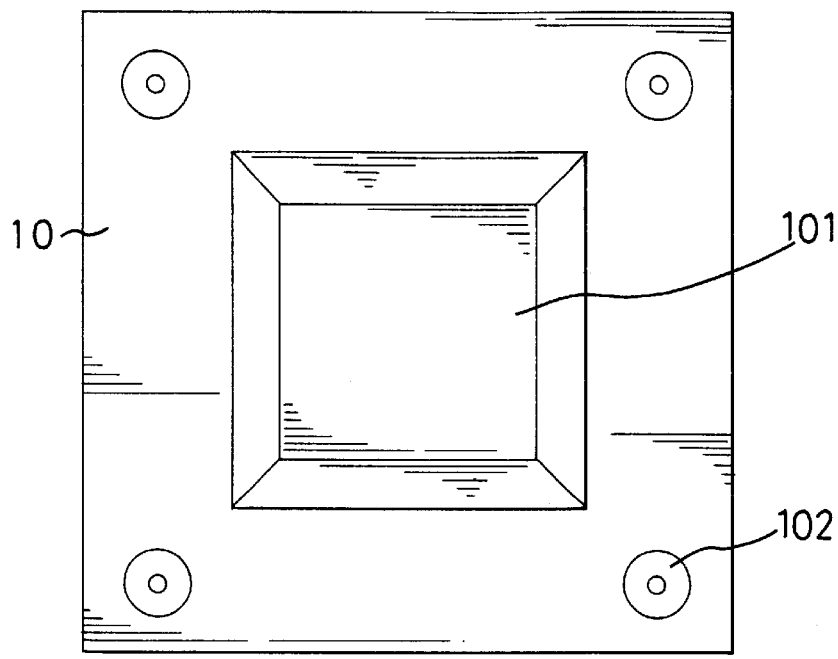
FIG. 2A is a top plain view of a heat sink used in the BGA semiconductor package shown in FIG. 1.
Figure 2B:
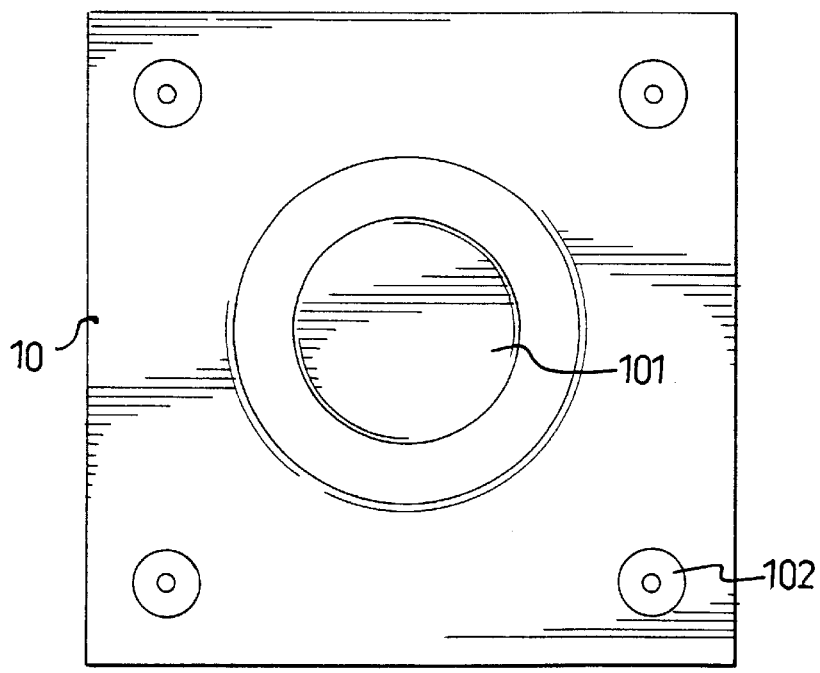
FIG. 2B a top plain view of another heat sink used in the BGA semiconductor package shown in FIG. 1.

With reference to FIG. 2A, the heat sink (10) is of rectangular shape having a protrusion area (101) in a center portion thereof. The protrusion area (101) may substantially have a rectangular shape, as shown in FIG. 2A, or a round shape, as shown in FIG. 2B. The heat sink (10) has four dents (102) formed on the four comers thereof, respectively, such that the heat sink (10) can stand on the substrate (12) by the dents (102). The protrusion area (101) covers the die (11) and bonding wire (16) to provide heat dissipation effect. To enhance the bonding strength between the heat sink (10) and the encapsulant (19), the heat sink (10) is sequentially coated with a metal medium layer (103) and an insulation layer (104). The metal medium layer (103) is made of metal material, such as chrome or chrome oxide, formed by a chromate conversion coating process. The insulation layer (104) is formed by electrodeposit method to coat epoxy resin material on the whole outer surface of the metal medium layer (103) or on a part of the outer surface that is contacted with the encapsulant (19). With such selected materials and surface processing method, a secure bonding between the heat sink (10) and the encapsulant (19) can be achieved. In details, the metal medium layer (103) and the heat sink (10), which is also made of metal material, can be securely bonded, and the chrome or the like of the metal medium layer (103) is easy to bond with insulation material. Therefore, the heat sink (10) can be securely bonded with the insulation layer (104) via the metal medium layer (103). Further, because the insulation layer (104) has high affinity with resin material, the encapsulant (19), that is formed by resin, can be securely bonded with the insulation layer (104). Accordingly, the bond between the heat sink (10) and the encapsulant (19) is so secure without forming any tiny gaps so that no moisture or contaminant is allowed to enter the encapsulant (19) to damage the semiconductor device. Thus, the quality of the semiconductor package is highly increased.

Figure 3:
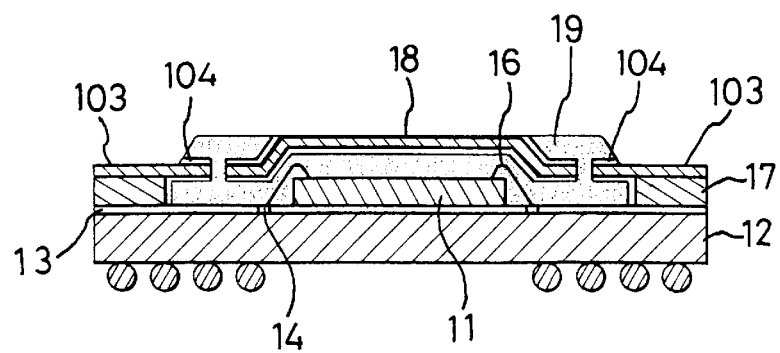
FIG. 3 is a side cross sectional view of a second preferred embodiment of the BGA semiconductor package in accordance with the present invention.

FIG. 3 shows a second preferred embodiment of the BGA semiconductor package in accordance with the present invention, which has a heat ring (17) combined with a heat slug (18) to enhance the heat dissipation efficiency and electrical performance. The heat ring (17) is secured to the upper face of the substrate (12) by adhesive to surround the die (11) and bonding wires (16). The heat slug (18) is securely mounted onto the heat ring (17) by adhesive to fully cover the die (11) and bonding wires (16). The die (11) and bonding wires (16) are encapsulated and protected by an encapsulant (19). The surface area of the heat ring (17) and heat slug (18) that is contacted with the encapsulant (19) is sequentially coated with a metal medium layer (103) and an insulation layer (104) to enhance the bonding strength.

Figures 5A, 5B:
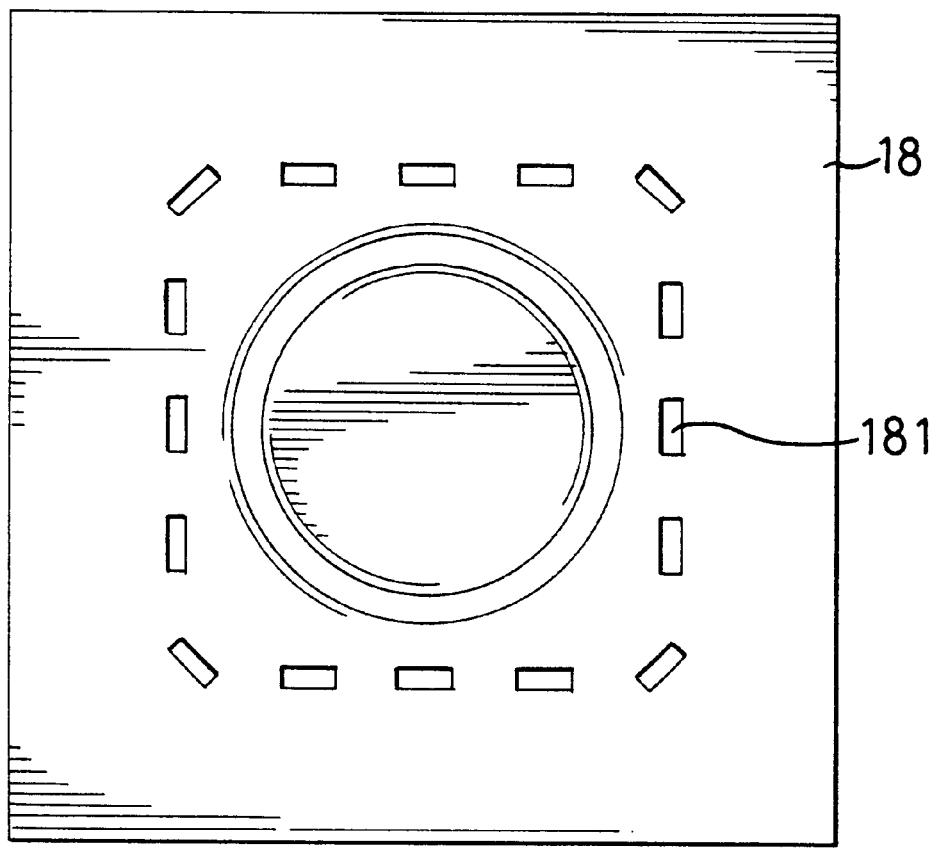
FIG. 5A is a top plain view of a heat slug used in the BGA semiconductor package shown in FIG. 3.
FIG. 5B is a side cross sectional view of the heat slug used in the BGA semiconductor package shown in FIG. 3.
Figure 6:
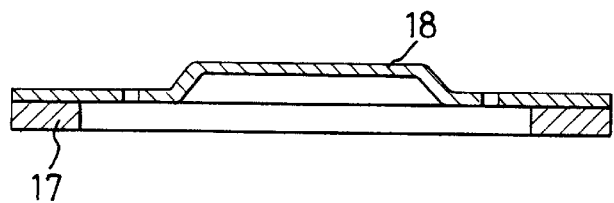
FIG. 6 is a side cross sectional view of a combination of the heat ring and heat slug shown in FIG. 3.
Figure 7:
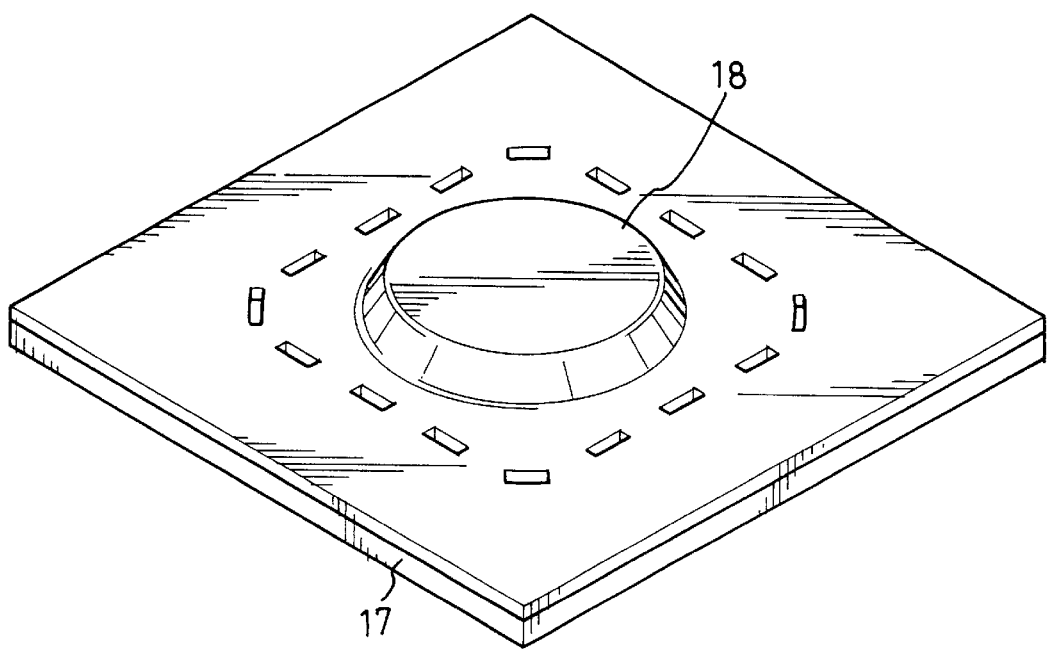
FIG. 7 is a perspective view of the combination of the heat ring and heat slug shown in FIG. 3.

FIG. 4A and FIG. 4B illustrate the structure of the heat ring (17), which is substantially of a hollow rectangular shape. FIG. 5A and FIG. 5B illustrate the structure of the heat slug (17), which is of a hat shape having a protrusion in the center portion thereof and a flat rim on the edge portion. A plurality of apertures (181) are defined in the edge portion of the heat slug (17) so that encapsulation material can flow to the die (11) and bonding wires (16) to form the encapsulant (19) via the apertures (181) in a underfill process. Similar to the heat ring (17), the heat slug (17) also has a rectangular shape whose dimension is the same as the heat ring (17) so that a maximum heat dissipation efficiency can be obtained. With reference to FIG. 6 and FIG. 7, the heat slug (18) is combined with the heat ring (17) by adhering the edge portion of the heat slug (18) to the heat ring (17). The combination of the heat ring (17) and the heat slug (18) is mounted to the substrate (12) by adhering, as shown in FIG. 3, to fully cover the die (11), bonding wires (16) and conductive trace (14) on the substrate (12) thereby providing an overall metal shielding effect to highly enhance the electrical performance of the semiconductor device. Furthermore, the heat generated by the die (11) can be dissipated via all the surface area of the semiconductor package so that the heat dissipation efficiency is high.

To encapsulate the die (11) and bonding wires (16), encapsulation material is filled via the apertures (181) into an inner space surrounded by the heat ring (17), heat slug (18) and substrate (12), and covers the edge portion of the heat slug (18). Therefore, the encapsulant (19) formed in the inner space is bonded to the substrate (12) by adhering with the solder mask (13). Because the encapsulant (19) has a relative high adhesive degree with the solder mask (13), the reliability of the packaged semiconductor can be increased. Moreover, an additional heat sink can be attached onto the heat slug (18) to further enhance the heat dissipation efficiency.

Figure 9:
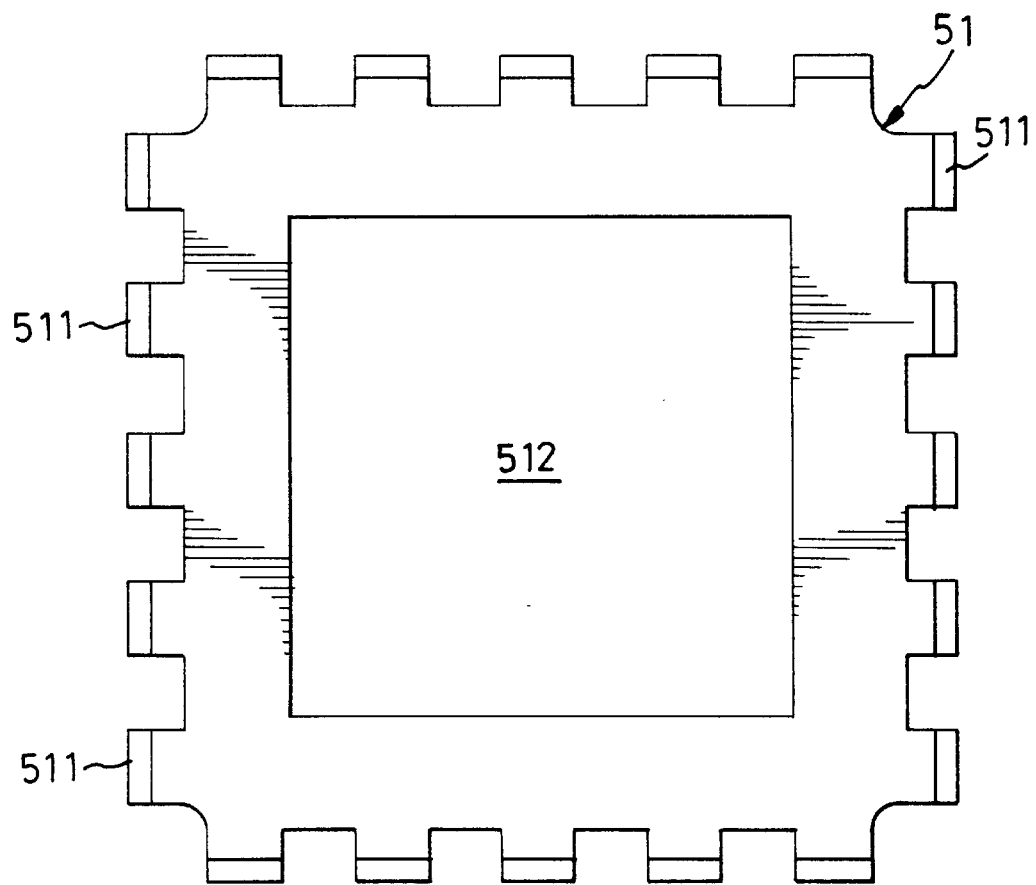
FIG. 9 is a top plain view of a heat sink used in the BGA semiconductor package shown in FIG. 8.
Figure 8:
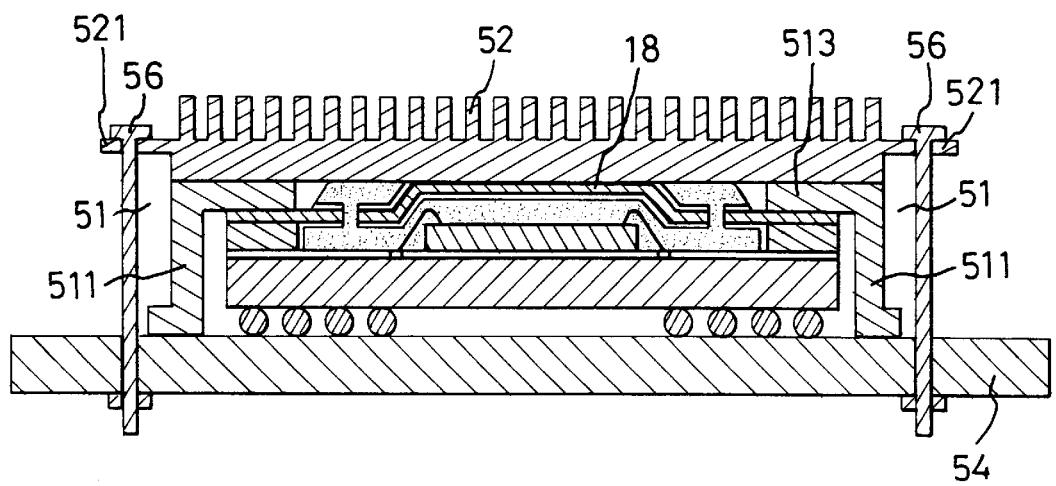
FIG. 8 is a side cross sectional view of a third preferred embodiment of the BGA semiconductor package in accordance with the present invention.

FIG. 8 shows a third preferred embodiment of the BGA semiconductor package in accordance with the present invention, which is different from the previous embodiment in having a support seat (51) to support a large heat sink (52) that is mounted on the top of the heat slug (18). With reference to FIG. 9, the support seat (51) has a rectangle plate (513) and a plurality of legs (511) extended downwardly from the edge of the rectangle plate (513). An opening (512) is defined in the center portion of the rectangle plate (513). With such a support seat (51), when a packaged semiconductor device is mounted on a printed circuit board (54), the support seat (51) can wrap around the packaged semiconductor device such that the legs (511) stands on the printed circuit board (54) and the bottom face of the rectangle plate (513) closely contact with the edge of the heat slug (18). Further, the protrusion portion of the heat slug (18) is exposed via the opening (512) and the top of the heat slug (18) is at the same level with the upper face of the rectangle plate (513) so that the large heat sink (52) can be firmly disposed on the top of the heat slug (18) with the support of the support seat (51) thereby enhancing the heat dissipation efficiency. Further, the large heat sink (52) has a pair of diagnostically disposed ears (521). By extending two screws (56) through the ears (521) and the printed circuit board (54), the heat sink (52) and the support seat (511) can be secured to the printed circuit board (12). In addition, the support seat (51) is made of metal material which can further enhance the heat dissipation efficiency.

Although the present invention has been explained in relation to its preferred embodiment, it is to be understood that many other possible modifications and variations can be made without departing from the spirit and scope of the invention as hereinafter claimed.

What is claimed is:

1. A ball grid array semiconductor package, comprising:
   a substrate having an upper face formed thereon a solder mask and electrical conductive trace, and a lower face formed thereon a plurality of solder balls for signal input and output;

a die mounted on the upper face of said substrate and electrically connected to the electrical conductive trace of said substrate by bonding wires;

a heat ring mounted on the upper face of said substrate to surround said die and said bonding wires;

a heat slug mounted on the heat ring to cover said die and said bonding wires, and having a plurality of apertures defined in an edge portion; and an encapsulant to encapsulate said die and said bonding wires.

2. The ball grid array semiconductor package as claimed in claim 1, wherein said heat ring and said heat slug has at least a portion of surface area sequentially coated with a metal medium layer and an insulation layer, which is contacted with said encapsulant.

3. The ball grid array semiconductor package as claimed in claim 2, wherein said insulation layer is made of epoxy resin.

4. The ball grid array semiconductor package as claimed in claim 2, wherein said metal medium layer is made of chrome or chrome oxide.

5. The ball grid array semiconductor package as claimed in claim 2, wherein said heat ring is substantially of a hollow rectangular shape.

6. The ball grid array semiconductor package as claimed in claim 1, wherein said heat slug is of a hat shape.

7. The ball grid array semiconductor package as claimed in claim 6, wherein said heat slug is securely mounted to said heat ring by adhesive.

8. The ball grid array semiconductor package as claimed in claim 1, wherein said encapsulant is bonded to the substrate by adhering with said solder mask.

9. The ball grid array semiconductor package as claimed in claim 1, wherein said encapsulant is formed by filling encapsulation material via said plurality of apertures into an inner space surrounded by said heat ring, heat slug and substrate.

10. The ball grid array semiconductor package as claimed in claim 1, wherein said heat ring and said heat slug are made of metal.

11. The ball grid array semiconductor package as claimed in claim 9 further comprising a heat sink attached onto the heat slug.

12. The ball grid array semiconductor package as claimed in claim 11 further comprising a support seat wrapped around said semiconductor package to support said heat sink.

13. The ball grid array semiconductor package as claimed in claim 11, wherein said support seat has a rectangle plate and a plurality of legs extended downwardly from the edge of said rectangle plate said rectangle plate has a center portion defined therein an opening, said plurality of legs being adapted to stand on a printed circuit board such that said rectangle plate closely contacts with said heat slug and said heat slug is exposed via said opening.

14. The ball grid array semiconductor package as claimed in claim 13, wherein said heat sink has two ears for securing said heat sink to said print circuit board by extending two screws through said two ears and said printed circuit board.

15. The ball grid array semiconductor package as claimed in claim 13, wherein said support seat is made of metal.

16. A ball grid array semiconductor package, comprising:

a substrate having an upper face formed thereon a solder mask and electrical conductive trace, and a lower face formed thereon a plurality of solder balls for signal input and output;

a die mounted on the upper face of said substrate and electrically connected to the electrical conductive trace of said substrate by bonding wires;

a heat sink mounted on the upper face of said substrate to cover said die and said bonding wires, wherein said heat sink is sequentially coated with a metal medium layer and an insulation layer; and an encapsulant to encapsulate said die and said bonding wires.

17. The ball grid array semiconductor package as claimed in claim 16, wherein said insulation layer is coated on a surface area of said heat sink that is contacted with said encapsulant.

18. The ball grid array semiconductor package as claimed in claim 17, wherein said insulation layer is made of epoxy resin.

19. The ball grid array semiconductor package as claimed in claim 17, wherein said metal medium layer is made of chrome or chrome oxide.

\* \* \* \* \*